United States Patent
Hanselmann

(10) Patent No.: US 6,822,521 B2
(45) Date of Patent: Nov. 23, 2004

(54) OSCILLATING CIRCUIT WITH REDUCED DECAY AND TRANSIENT TIMES

(75) Inventor: Dieter Hanselmann, Oehringen (DE)

(73) Assignee: Atmel Germany GmbH, Heilbronn (DE)

( * ) Notice: Subject to any disclaimer, the term of this patent is extended or adjusted under 35 U.S.C. 154(b) by 0 days.

(21) Appl. No.: 10/453,233

(22) Filed: Jun. 2, 2003

(65) Prior Publication Data

US 2003/0206069 A1 Nov. 6, 2003

Related U.S. Application Data

(63) Continuation of application No. 09/842,612, filed on Apr. 26, 2001, now Pat. No. 6,593,824.

(30) Foreign Application Priority Data

Jun. 24, 2000 (DE) .......................................... 100 30 952

(51) Int. Cl.⁷ ............................................... H03B 1/00
(52) U.S. Cl. ..................................... 331/117 R; 331/74
(58) Field of Search ............................... 331/117 R, 74, 331/14, 55, 167

(56) References Cited

U.S. PATENT DOCUMENTS

| | | | |
|---|---|---|---|
| 3,949,388 A | | 4/1976 | Fuller |
| 3,991,388 A | * | 11/1976 | Harshbarger ............ 331/117 R |
| 4,199,734 A | * | 4/1980 | Dressen ........................ 331/76 |
| 4,236,523 A | | 12/1980 | Gruenenwald |
| 4,453,162 A | | 6/1984 | Money et al. |
| 4,617,534 A | * | 10/1986 | Lill ......................... 331/117 R |

FOREIGN PATENT DOCUMENTS

| | | |
|---|---|---|
| DE | 3248010 | 11/1983 |
| DE | 3733943 | 4/1989 |

OTHER PUBLICATIONS

"Functional Description", U2270B, Rev.A4, Nov. 19, 1998., TEMIC Semiconductors; p. 404.

* cited by examiner

*Primary Examiner*—Robert Pascal
*Assistant Examiner*—Joseph Chang
(74) *Attorney, Agent, or Firm*—W. F. Fasse; W. G. Fasse

(57) ABSTRACT

A circuit arrangement for reducing the decay and build-up transient times of an intermittently operating oscillating circuit increases the data transmission rate of a transmission unit using such an oscillating circuit. A control unit is connected to the oscillating circuit including a capacitor, a coil, and a resistor. A switch element controlled by the control unit selectively connects a voltage source to the capacitor, or selectively connects a current source to the coil. In the former case, another switch element selectively disconnects the capacitor from the coil and the resistor. In this circuit arrangement the current and/or the voltage are maintained when the excitation voltage for the oscillating circuit is interrupted. This eliminates the decay of the oscillating circuit amplitudes. When the excitation voltage is switched on again, the oscillating circuit continues oscillating without delay.

31 Claims, 2 Drawing Sheets

OSCILLATING CIRCUIT WITH REDUCED DECAY AND TRANSIENT TIMES

CROSS-REFERENCE TO RELATED APPLICATION

The present application is a Continuation Application of my U.S. patent application Ser. No. 09/842,612, filed on Apr. 26, 2001, now U.S. Pat. No. 6,593,824.

BACKGROUND

1. Field of the Invention

The present invention relates to a circuit arrangement for reducing the decay and start-up transient times of oscillating circuits.

2. Description of the Related Technology

The excitation voltage is switched on and off quickly in oscillating circuits working in intermittent operation. As well as these two stable states, transient states also occur during which the amplitude of the oscillation decays or is built up again. The faster the switching processes take place in a given time period, the greater the proportion of the times during which the oscillation decays or starts again compared to the times in which the oscillating circuit is in a stable state. In order to calculate the proportion of time taken by the transient states:

$$U = U_{max} \cdot \exp(n \cdot p / Q) \quad (1)$$

provides an exponential description for the decay behavior of the voltage in the oscillating circuit, in which n is the number of periods and a the quality of the oscillating circuit. From the assumption that the oscillation has decayed when the amplitude has fallen to 10% of the maximum value, equation (2) gives at least 10 periods as the number of periods required for this with a quality of Q=14:

$$n = Q/p \cdot |\ln(U/U_{max})| = 14/p \cdot |\ln(10\%/100\%)| = 10 \quad (2)$$

Furthermore, equation (2) shows that the number of periods required also increases linearly as the quality increases. An oscillating circuit frequency of, for example, 100 kHz gives a decay time of 100 $\mu$s. This doubles to 200 $\mu$s when the starting time is taken into account, provided that the starting time is based on approximately the same functional relationship used for calculating the decay time.

Transmitting and receiving units used for transferring data are an important area of application for systems with oscillating circuits working in intermittent operation. For this purpose the oscillating circuit is switched on and off in the transmission units. All the decay and starting times in the oscillating circuit reduce the data transmission rate because the transmission gaps are increased. In the case of digital data transmission at a frequency of, for example, several hundred kHz, the amount of time in the stable state is of the same order as the amount of time in the transient states. A high data transmission rate is very important for use in the field of contactless identification, particularly in the automotive field for the authentication process of transponder and base unit, because the maximum period of time available for the entire process is only 150 ms. If the transponder is supplied with energy from the base unit by inductive means, the transient states of the oscillating circuits lengthen the times during which the transponder cannot pick up any energy from the field of the base unit Processes which function according to the previous state of the art are known, for example, from the data book of TEMIC Semiconductor GmbH, 1999, p. 404, FIG. 4. The circuit arrangement shown for implementing the process is used in the field of contactless identification systems for triggering oscillating circuit coils in the base units in order to transfer the data and energy to the transponders. According to page 338 of the data book, at an oscillating circuit frequency of 130 kHz the transmission gaps of the base unit lie between 160 $\mu$s and 400 $\mu$s, depending upon the quality of the oscillating circuit used. The duration of the authentication process between transponder and base unit is at least 50 ms, and this increases up to 120 ms as the quality of the transmission circuits used increases.

The disadvantage of the previous processes for driving the oscillating circuits is that the transient states reduce the data transmission rates of oscillating circuits working in intermittent operation. This results in increased times for the authentication process in the field of contactless identification systems. If the transponder is supplied with energy from the base unit by inductive means, the energy transfer to the transponder is reduced by the longer transmission gaps. The dance between the base unit and transponder, which lies in the range of a few cm, is thus reduced.

SUMMARY OF THE INVENTION

An object of the present invention is to specify a process with which the build-up and decay times in oscillating circuits can be significantly reduced in order to increase the data transmission rate between transmission and receiving units. A further object of the invention is to specify a circuit arrangement for implementing the process which can be manufactured easily and economically.

The above objects have been achieved according to the invention in a circuit arrangement for reducing the decay and build-up transient times in an oscillating circuit that operates intermittently and that has at least one capacitor, at least one coil, a control unit which excites the oscillating circuit, at least one switching element, and a current source or a voltage source. The particular features of the invention will be described next.

According to this, the essence of the invention is that, when the excitation voltage of an oscillating circuit is interrupted, the amplitudes of one of the physical quantities which characterize the oscillation are held at their maximum values until the excitation voltage of the oscillating circuit is switched on again. This means that the oscillating circuit can continue oscillating at the maximum amplitude of the quantity which has been maintained without any delay. The applicants investigations have shown that the current or the voltage can be used as characteristic quantities and that one of these quantities can be held both in parallel and serial oscillating circuits it is particularly advantageous if the oscillating circuits are excited with their resonant frequency.

The operation of one embodiment of a circuit arrangement according to the invention will first be explained for the case in which the current is held at its maximum value. When the excitation voltage is interrupted by a switching element driven by a control unit, which excites the oscillating circuit, a current source is linked to the coil of the oscillating circuit which holds the current through the coil at its maximum value. When the excitation voltage is switched on again by the control unit by means of the switching element, the link between the current source and the oscillating circuit is separated again, and the oscillating circuit can continue oscillating at its maximum amplitude without delay. This arrangement is particularly advantageous because the blocking property of the capacitor means that the oscillating circuit does not need to be separated to connect the current source.

A further embodiment of a circuit arrangement according to the invention can be implemented for holding the voltage. To do this, when the excitation voltage is interrupted by a first switching element, a control unit, which excites the oscillating circuit, separates the link between coil and capacitor, and links a voltage source to the capacitor by means of a second switching element in order to hold the voltage at the capacitor at its maximum value.

When the excitation voltage is switched on again, the control unit remakes the link between the coil and the capacitor by means of the first switching element, and separates the voltage source from the oscillating circuit by means of the second switching element so that the oscillating circuit can immediately continue oscillating at its maximum amplitude.

BRIEF DESCRIPTION OF THE FIGURES

The invention is described and explained in the following by means of the drawings, FIGS. 1 to 4. They show.

DESCRIPTION OF THE PREFERRED EMBODIMENTS

Figure 1:
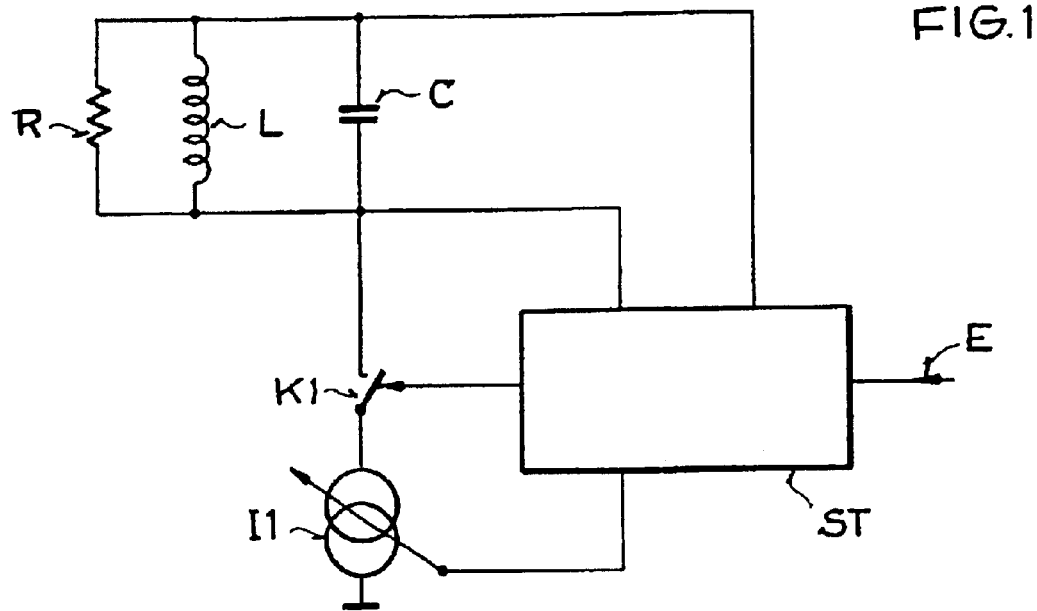
FIG. 1 A first embodiment of the invention for maintaining the current in a parallel oscillating circuit, FIG. 2 A second embodiment of the invention for maintaining the voltage in a parallel oscillating circuit, FIG. 3 A third embodiment of the invention for maintaining the current in a serial oscillating circuit, FIG. 4 A final embodiment of the invention for maintaining the voltage in a serial oscillating circuit

The block diagram in FIG. 1 shows a first advantageous implementation of the circuit arrangement according to the invention for a parallel oscillating circuit. This consists of a coil L, a capacitor C and a resistor R, and is excited with its resonant frequency by a control unit ST which is linked to the oscillating circuit. Furthermore, a switching element K1 is connected to the oscillating circuit, this switching element links a controllable current source I1 to the oscillating circuit, this current source is connected to the reference potential. The control inputs of the current source I1 and of the switching element K1 are each linked to the control unit ST. The control unit ST also possesses an Input E over which it can be triggered. The starting point of the functional description is the state in which the control unit ST excites the oscillating circuit with its resonant frequency. In this state, the switching element K1 is open. If the control unit ST is triggered by an input signal, the control unit interrupts the excitation of the oscillating circuit at the time at which the current through the coil L has reached its maximum value. At the same time, the control unit ST links the current source I1 to the oscillating circuit by means of the switching element K1 in order to hold the current through the coil L at its maximum value. To do this, the current of the current source I1 is set by the control unit ST such that it corresponds to the sum of the two currents through the resistor R and the coil L The current flow through the capacitor is negligible because, in the case of direct current, the capacitor C has an infinitely high resistance. If the control unit ST is triggered once again by an input signal, the control unit ST separates the current source I1 from the oscillating circuit by means of the switching element K1, and the excitation of the oscillating circuit is resumed at this time, and the oscillating circuit can continue to oscillate at its maximum amplitude.

Figure 2:
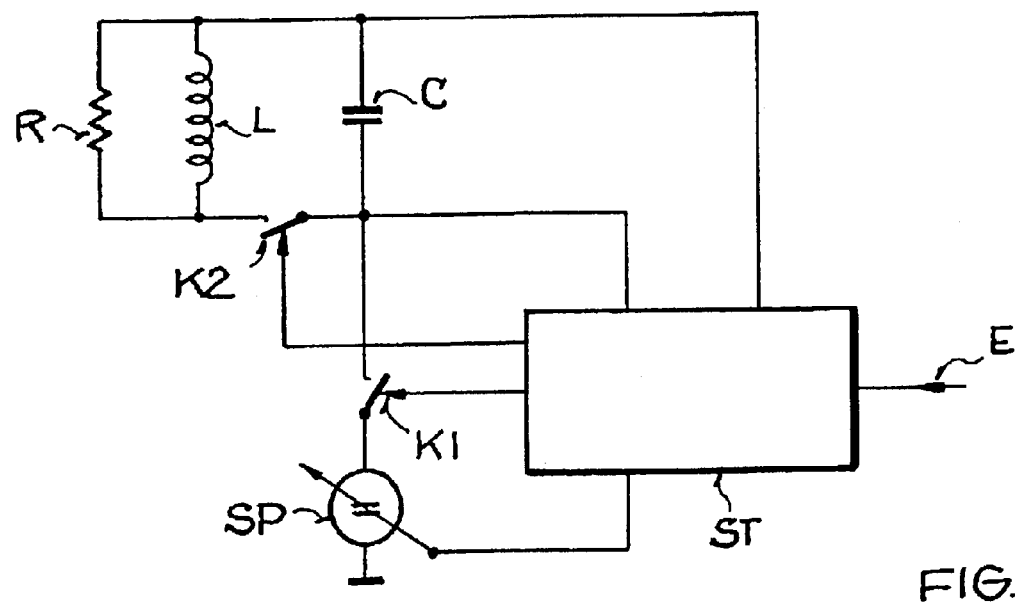

The block diagram in FIG. 2 shows a further embodiment of the circuit arrangement according to the invention for a parallel oscillating circuit in contrast to the arrangement shown in FIG. 1, the voltage of the oscillating circuit is held instead of the current to do this, a parallel oscillating circuit consisting of a coil L, a capacitor C and a resistor R, is excited with its resonant frequency by a control unit ST which is linked to the oscillating circuit in order to be able to separate the link between the coil L and the capacitor C, they are connected by means of a switching element K2. Furthermore, a switching element K1 is connected to the oscillating circuit, this switching element links a controllable voltage source SP to the oscillating circuit, this voltage source SP is connected to the reference potential. The control inputs of the voltage source SP and the switching element K1 are linked for their part to the control unit ST. The control unit ST also possesses an input E over which it can be triggered. When it has been triggered, the task of the control unit ST is to interrupt the excitation of the oscillating circuit at the time at which the voltage at capacitor C has reached its maximum value, and at the same time to link the voltage source SP to the oscillating circuit by means of the switching element K1, and to break the link between the capacitor C on one side and the coil L and the resistor R on the other side so that no current can flow over the two passive components. The voltage of the voltage source SP is set by the control unit ST at a level corresponding to that of the voltage at the capacitor C. If the control unit ST Is triggered again, the voltage source SP is separated from the oscillating circuit by the switching element K1, and the link between the capacitor C, the coil L and the resistor R Is restored by means of the switching element K2, and the excitation of the oscillating circuit is resumed at this time so that the oscillating circuit can continue to oscillate at its maximum amplitude. There is no need to maintain the voltage source SP provided that the capacitor C only has very low leak currents and the excitation of the oscillating circuit is only interrupted for a short time. The circuit arrangement is considerably simpler under these conditions.

Figure 3:
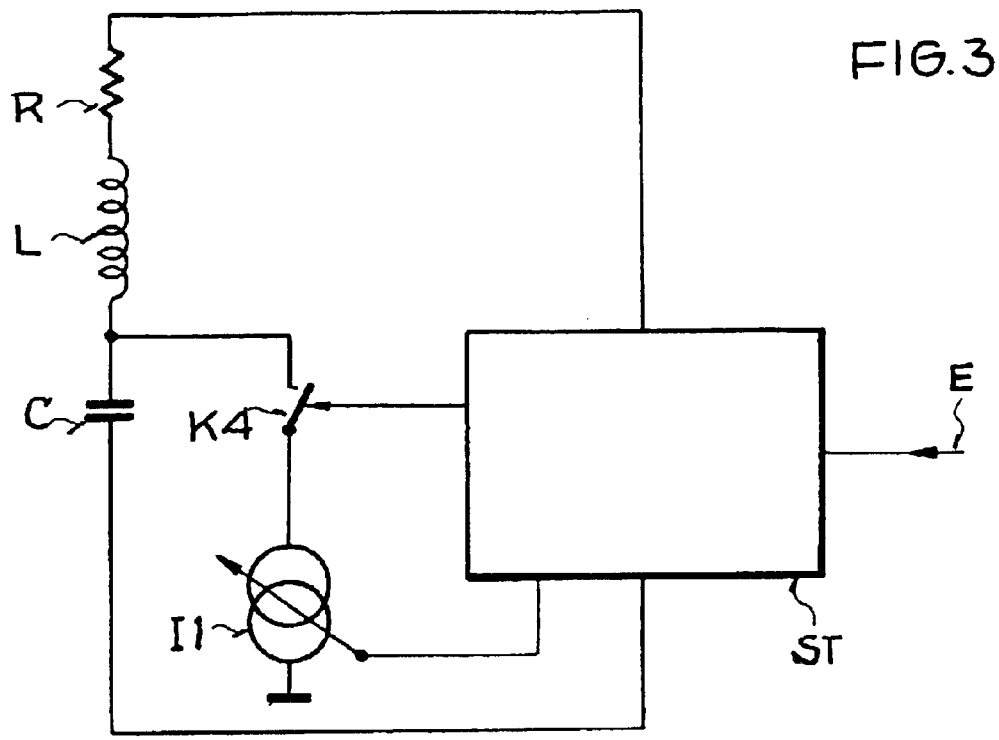

The block diagram in FIG. 3 shows an implementation of the circuit arrangement according to the invention for a serial oscillating circuit. This consists of a resistor R, a coil L and a capacitor C which are linked in a series circuit, and is excited with its resonant frequency by a control unit ST which is linked to the oscillating circuit. Furthermore, a switching element K4 is connected to the coil L and capacitor C, this switching element links a controllable current source I1 to the oscillating circuit, this current source is linked to the reference potential. The control inputs of the current source I1 and the switching element K4 are linked for their part to the control unit ST. Furthermore, the control unit ST also has an input E over which it can be triggered. When it has been triggered by a signal, the task of the control unit ST is to interrupt the excitation of the oscillating circuit at the time at which the current through the coil L has reached its maximum value, and at the same time to link the current source I1 with the oscillating circuit by means of the switching element K4, so that the current through the coil L is held at this value. In the case of direct current, the capacitor C has an infinitely high resistance, so the current flow through the capacitor C can be disregarded. If the control unit ST is triggered once more, the current source I1 is separated from the oscillating circuit by the switching element K1, and the excitation of the oscillating circuit is resumed at this time so that the oscillating circuit continues to oscillate at its maximum amplitude.

Figure 4:
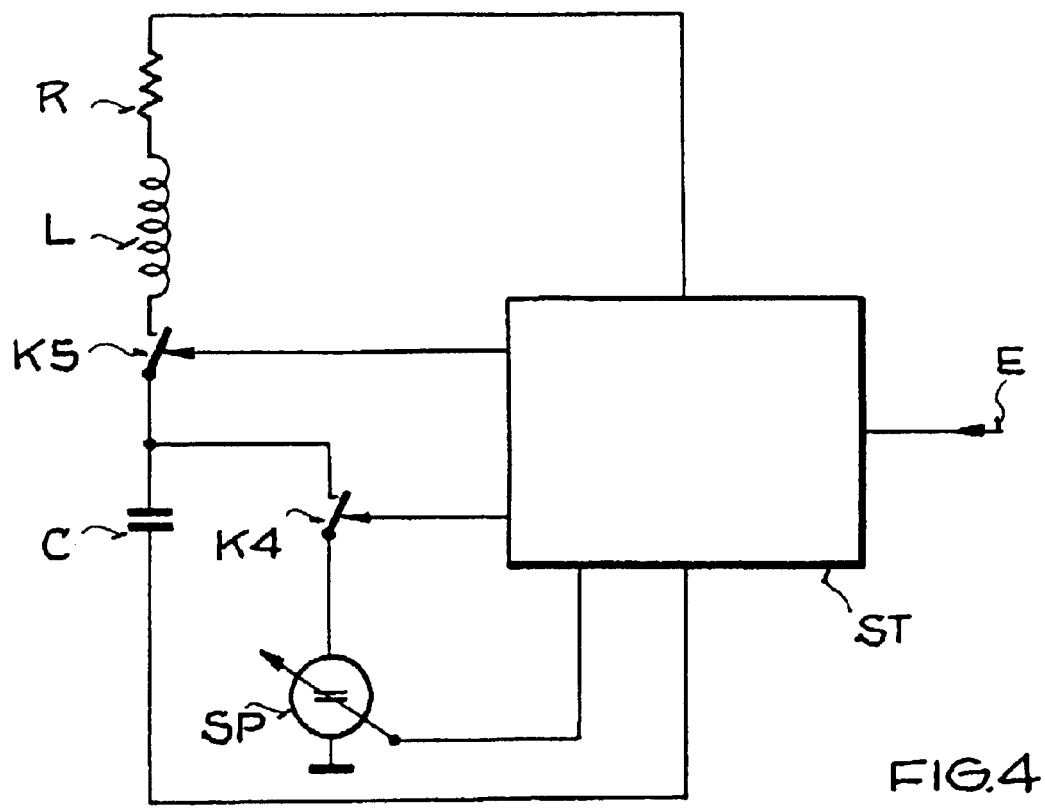

The block diagram in FIG. 4 shows a further implementation of the circuit arrangement according to the invention for a serial oscillating circuit in which, in contrast to the arrangement shown in FIG. 3, the voltage of the oscillating circuit is now held instead of the current to do this, a serial oscillating circuit consisting of a coil L, a capacitor C and a resistor R is excited with its resonant frequency by a control unit ST which is linked to the oscillating circuit in order to be able to separate the link between the coil L and the capacitor C, they are connected by means of a switching element K5. Furthermore, a switching element K4 is connected to the oscillating circuit, this switching element links a controllable voltage source SP to the oscillating circuit, this voltage source is connected to the reference potential. The control inputs of the voltage source SP, the switching element K4 and the switching element K5 are each linked to the control unit ST. The control unit ST also possesses an input E over which it can be triggered. When it has been triggered, the task of the control unit ST is to interrupt the excitation of the oscillating circuit at the time at which the voltage at capacitor C has reached its maximum value, and at the same time to link the voltage source SP to the oscillating circuit by means of the switching element K4, and to break the link between capacitor C on one side and the coil L and the resistor R on the other side by means of the switching element K5 so that no current can flow over the two passive components. The voltage of the voltage source SP is set by the control unit ST at a level corresponding to that of the voltage at the capacitor C. If the control unit ST is triggered again, the control unit ST separates the voltage source SP from the oscillating circuit by means of the switching element K4, and restores the link between on the one side the capacitor C and on the other side the coil L and the resistor R by means of the switching element K5, and the excitation of the oscillating circuit is resumed at this time so that the oscillating circuit can continue to oscillate at its maximum amplitude. There is no need to connect the voltage source SP provided that the capacitor C only has very low leak currents and the excitation of the oscillating circuit is only interrupted for a short time. This means that the switching element K4 and a control output of the control unit ST can be dispensed with, which considerably simplifies the circuit arrangement in the case of the embodiments described, it is particularly advantageous to use transistors as switching elements, especially MOS transistors. Furthermore, the current and voltage sources need not be designed as controllable sources provided that the magnitude of the current and voltage amplitudes in the oscillating circuit is sufficiently constant in this respect, it should be pointed out that the process according to the invention does not place any special requirements upon the voltage and current sources.

The process according to the invention can be used with particular advantage in systems for wirebound and wireless data transmission because the data transmission rate in the oscillating circuits working in intermittent operation is significantly increased by the shortened transmission pauses. Furthermore, the use of the process according to the invention completes the authentication process in contactless identification systems more quickly, whereby the preferred application is in the base unit because it has its own power supply. The shortened transmission pauses enable a higher energy transfer from the base unit to the transponder, therefore their spacing is increased.

By avoiding the transient states, the data transmission rate will no longer be reduced as a result of such transient states. Therefore, even oscillating circuits of high quality, that is in the range of 100, can be used in transmission and receiving units in the field of contactless identification systems.

According to the previous state of the art, equation (2) gave decay times in the range of a few milliseconds for frequencies around 100 kHz, and could therefore only be used with difficulty in this field. Oscillating circuits of high quality can be used with the process according to the invention, and thus generate amplitudes of over 100 V in the transmission circuit from the low supply voltages of the base units. The energy transfer thus increases in transponders supplied by inductive means, and consequently the distance from the transponder to the base unit can also be increased.

What is claimed is:

1. A circuit arrangement comprising:
   an oscillating circuit including a capacitor and a coil;
   a control unit connected by first and second energizing leads to said oscillating circuit and adapted to selectively energize an oscillation of said oscillating circuit through said energizing leads;
   an electrical source having a source output terminal, and having a source control terminal connected to said control unit; and
   a first switching element that is interposed and connected between said source output terminal of said source and said oscillating circuit, and that has a first switch control terminal connected to said control unit;
   wherein said oscillating circuit is a parallel circuit having said capacitor and said coil connected in parallel with each other, said first energizing lead and said second energizing lead are respectively connected to opposite first and second sides of said capacitor and of said coil, said first switching element is interposed and connected between said source output terminal and said second side of said capacitor and of said coil, and said oscillating circuit further comprises a resistor connected in parallel between said first side and said second side.

2. A circuit arrangement comprising:
   an oscillating circuit including a capacitor and a coil;
   a control unit connected by first and second energizing leads to said oscillating circuit and adapted to selectively energize an oscillation of said oscillating circuit through said energizing leads;
   a controllable variable current source having a source output terminal, and having a source control terminal connected to said control unit; and
   a first switching element that is interposed and connected between said source output terminal of said source and said oscillating circuit, and that has a first switch control terminal connected to said control unit;
   wherein said oscillating circuit is a parallel circuit having said capacitor and said coil connected in parallel with each other, said first energizing lead and said second energizing lead are respectively connected to opposite first and second sides of said capacitor and of said coil, and said first switching element is interposed and connected between said source output terminal and said second side of said capacitor and of said coil.

3. A circuit arrangement comprising:
   an oscillating circuit including a capacitor and a coil;
   a control unit connected by first and second energizing leads to said oscillating circuit and adapted to selectively energize an oscillation of said oscillating circuit through said energizing leads;
   a current source having a source output terminal, and having a source control terminal connected to said control unit; and
   a first switching element that is interposed and connected between said source output terminal of said source and said oscillating circuit, and that has a first switch control terminal connected to said control units;

wherein said oscillating circuit is a parallel circuit having said capacitor and said coil connected in parallel with each other, said first energizing lead and said second energizing lead are respectively connected to opposite first and second sides of said capacitor and of said coil, and said first switching element is interposed and connected between said source output terminal and said second side of said capacitor and of said coil; and wherein said control unit is adapted to control said first switching element via said first switch control terminal so as to connect said source output terminal of said current source to said second side of said coil and of said capacitor when said control unit is not energizing said oscillation through said energizing leads, and so as to disconnect said source output terminal of said current source from said second side of said coil and said capacitor when said control unit is energizing said oscillation through said energizing leads.

4. The circuit arrangement according to claim 1, wherein said electrical source is a current source.

5. The circuit arrangement according to claim 4, wherein said second side of said capacitor and said second side of said coil are permanently and constantly connected to each other.

6. The circuit arrangement according to claim 4, wherein said current source is a fixed constant current source.

7. A circuit arrangement comprising:
   an oscillating circuit including a capacitor and a coil;
   a control unit connected by first and second energizing leads to said oscillating circuit and adapted to selectively energize an oscillation of said oscillating circuit through said energizing lead;
   a voltage source having a source output terminal, and having a source control terminal connected to said control unit; and
   a first switching element that is interposed and connected between said source output terminal of said source and said oscillating circuit, and that has a first switch control terminal connected to said control unit;
   wherein said oscillating circuit is a parallel circuit having said capacitor and said coil connected in parallel with each other, said first energizing lead and said second energizing lead are respectively connected to opposite first and second sides of said capacitor and of said coil, and said first switching element is interposed and connected between said source output terminal and said second side of said capacitor and of said coil.

8. The circuit arrangement according to claim 7, wherein said voltage source is a controllable variable voltage source.

9. The circuit arrangement according to claim 7, wherein said voltage source is a fixed constant voltage source.

10. The circuit arrangement according to claim 7, further comprising a second switching element, that is arranged in said oscillating circuit, and that is interposed and connected between said capacitor and said coil on said first side or on said second side, and that has a second switch control terminal connected to said control unit.

11. The circuit arrangement according to claim 10, wherein said first switching element is connected and interposed directly between said capacitor and said source output terminal of said voltage source, and wherein said first switching element and said second switching element are connected in series with each other between said coil and said source output terminal of said voltage source.

12. The circuit arrangement according to claim 10, wherein said control unit is adapted to control said first switching element via said first switch control terminal and to control said second switching element via said second switch control terminal so as to connect said source output terminal of said voltage source to said second side of said capacitor and to disconnect said coil from said capacitor and from said source output terminal of said voltage source when said control unit is not energizing said oscillation through said energizing leads, and so as to disconnect said source output terminal of said voltage source from said second side of said coil and said capacitor and to connect said coil to said capacitor when said control unit is energizing said oscillation through said energizing leads.

13. A circuit arrangement comprising:
   an oscillating circuit including a capacitor and a coil;
   a control unit connected by first and second energizing leads to said oscillating circuit and adapted to selectively energize an oscillation of said oscillating circuit through said energizing leads;
   an electrical source having a source output terminal, and having a source control terminal connected to said control unit; and
   a first switching element that is interposed and connected between said source output terminal of said source and said oscillating circuit, and that has a first switch control terminal connected to said control unit;
   wherein said oscillating circuit is a series circuit having said capacitor and said coil connected in series with each other, whereby an intermediate node is provided therebetween, said first energizing lead is connected to a first side of said coil opposite said intermediate node, said second energizing lead is connected to a second side of said capacitor opposite said intermediate node, and said first switching element is interposed and connected between said source output terminal and said intermediate node.

14. The circuit arrangement according to claim 13, wherein said oscillating circuit further comprises a resistor connected in series with said coil between said intermediate node and said first energizing lead.

15. The circuit arrangement according to claim 13, wherein said electrical source is a current source.

16. The circuit arrangement according to claim 15, wherein said capacitor and said coil are permanently and constantly connected to each other through said intermediate node.

17. The circuit arrangement according to claim 15, wherein said current source is a controllable variable current source.

18. The circuit arrangement according to claim 15, wherein said current source is a fixed constant current source.

19. The circuit arrangement according to claim 15, wherein said control unit is adapted to control said first switching element via said first switch control terminal so as to connect said source output terminal of said current source to said intermediate node when said control unit is not energizing said oscillation through said energizing leads, and so as to disconnect said source output terminal of said current source from said intermediate node when said control unit is energizing maid oscillation through said energizing leads.

20. The circuit arrangement according to claim 13, wherein said electrical source is a voltage source.

21. The circuit arrangement according to claim 20, wherein said voltage source is a controllable variable voltage source.

22. The circuit arrangement according to claim 20, wherein said voltage source is a fixed constant voltage source.

23. The circuit arrangement according to claim 20, further comprising a second switching element, that is arranged in said oscillating circuit, and that is interposed and connected between said intermediate node and said coil, and that has a second switch control terminal connected to said control unit.

24. The circuit arrangement according to claim 23, wherein said first switching element is connected via said intermediate node and interposed directly between said capacitor and said source output terminal of said voltage source, and wherein said first switching element and said second switching element are connected in series with each other via said intermediate node between said coil and said source output terminal of said voltage source.

25. The circuit arrangement according to claim 23, wherein said control unit is adapted to control said first switching element via said first switch control terminal and to control said second switching element via said second switch control terminal so as to connect said source output terminal of said voltage source via said intermediate node to said capacitor and to disconnect said coil from said intermediate node, said capacitor and said source output terminal of said voltage source when said control unit is not energizing said oscillation through said energizing leads, and so as to disconnect said source output terminal of said voltage source from said intermediate node and to connect said coil to said capacitor via said intermediate node when said control unit is energizing said oscillation through said energizing leads.

26. A method of operating a circuit arrangement including:
an oscillating circuit including a capacitor and a coil;
a control unit connected by first and second energizing leads to said oscillating circuit and adapted to selectively energize an oscillation of said oscillating circuit through said energizing leads;
a current source having a source output terminal, and having a source control terminal connected to said control unit; and
a first switching element that is interposed and connected between said source output terminal of said source and said oscillating circuit, and that has a first switch control terminal connected to said control unit;
for reducing at least a start-up transient time of said oscillation, wherein said method comprises the steps:
a) operating said control unit to energize said oscillation of said oscillating circuit through said energizing leads, and to open said first switching element so as to disconnect said source output terminal of said current source from said oscillating circuit;
b) operating said control unit to cease said energizing of said oscillation of said oscillating circuit through said energizing leads, to close said first switching element so as to connect said source output terminal of said current source to said oscillating circuit and thereby to drive a current from said current source through said coil; and
c) repeating said step a) and b).

27. The method according to claim 26, wherein said current source is operated to provide said current as a constant current during said step b) with a current magnitude matching an instantaneous magnitude of a current flowing an said coil upon ending said step a) and beginning said step b).

28. The method according to claim 27, wherein said instantaneous magnitude is a maximum magnitude of said current flowing in said coil during said oscillation.

29. A method of operating a circuit arrangement including:
an oscillating circuit including a capacitor and a coil;
a control unit connected by first and second energizing leads to said oscillating circuit and adapted to selectively energize an oscillation of said oscillating circuit through said energizing leads;
a voltage source having a source output terminal, and having a source control terminal connected to said control unit;
a first switching element that is interposed and connected between said source output terminal of said source and said oscillating circuit, and that has a first switch control terminal connected to said control unit; and
a second switching element that is arranged and connected between said coil and said capacitor so as to selectively connect and disconnect said coil and said capacitor relative to each other and that has a second switch control terminal connected to said control unit;
for reducing at least a start-up transient time of said oscillation, wherein said method comprises the steps:
a) operating said control unit to energize said oscillation of said oscillating circuit through said energizing leads, to open said first switching element so as to disconnect said source output terminal of said voltage source from said oscillating circuit, and to close said second switching element so as to connect said coil and said capacitor relative to each other;
b) operating said control unit to cease said energizing of said oscillation of said oscillating circuit through said energizing leads, to close said first switching element so as to connect said source output terminal of said voltage source to said oscillating circuit and thereby to apply a voltage from said voltage source to said capacitor, and to open said second switching element so as to disconnect said coil from said capacitor; and
c) repeating said steps a) and b).

30. The method according to claim 29, wherein said voltage source is operated to provide said voltage as a constant voltage during said step b) with a voltage magnitude matching an instantaneous magnitude of a voltage on said capacitor upon ending said step a) and beginning said step b).

31. The method according to claim 30, wherein said instantaneous magnitude is a maximum magnitude of said voltage on said capacitor during said oscillation.

* * * * *

UNITED STATES PATENT AND TRADEMARK OFFICE
CERTIFICATE OF CORRECTION

PATENT NO. : 6,822,521 B2
DATED : November 23, 2004
INVENTOR(S) : Hanselmann

It is certified that error appears in the above-identified patent and that said Letters Patent is hereby corrected as shown below:

Title page,
Item [57], ABSTRACT,
Line 11, after "arrangement", insert -- , --;

Column 1,
Line 32, after "periods and", replace "a" by -- Q --;
Line 38, after "/p·|" (both occurrences), replace "in" by -- In --;

Column 2,
Line 47, before "investigations", replace "applicants" by -- applicant's --;
Line 50, after "oscillating", replace "circuits it" by -- circuits. It --;

Column 3,
Line 44, after "possesses an", replace "Input" by -- input --;

Column 4,
Lines 1 and 6, after "oscillating", replace "circuit in" by -- circuit. In --;
Line 3, after "instead of the", replace "current to" by -- current. To --;
Line 26, after "unit ST", replace "Is" by -- is --;
Line 29, after "resistor R", replace "Is" by -- is --;

Column 5,
Line 2, after "instead of the", replace "current to" by -- current. To --;
Line 5, after "oscillating", replace "circuit in" by -- circuit. In --;
Line 40, after "circuit", replace "arrangement" by -- arrangment. -- then start a new paragraph, replace "in the case" by -- In the case --;
Line 46, after "sufficiently", replace "constant in" by -- constant. In --;
Line 52, after "systems for" replace "wirebound" by -- wire-bound --;

Column 7,
Line 2, after "said control", replace "units;" by -- unit; --;
Line 34, after "energizing", replace "lead;" by -- leads; --;

Column 8,
Line 61, after "energizing", replace "maid" by -- said --;

UNITED STATES PATENT AND TRADEMARK OFFICE
CERTIFICATE OF CORRECTION

PATENT NO. : 6,822,521 B2
DATED : November 23, 2004
INVENTOR(S) : Hanselmann

It is certified that error appears in the above-identified patent and that said Letters Patent is hereby corrected as shown below:

Column 10,
Line 5, before "said coil", replace "an" by -- in --.

Signed and Sealed this

Twelfth Day of April, 2005

JON W. DUDAS
*Director of the United States Patent and Trademark Office*